United States Patent
Lee et al.

(10) Patent No.: US 9,921,664 B2
(45) Date of Patent: Mar. 20, 2018

(54) KEYBOARD DEVICE

(71) Applicant: Darfon Electronics Corp., Taoyuan (TW)

(72) Inventors: Chien-Hsin Lee, New Taipei (TW); Wei-Chan Sung, Taichung (TW)

(73) Assignee: DARFON ELECTRONICS CORP., Taoyuan (TW)

(*) Notice: Subject to any disclaimer, the term of this patent is extended or adjusted under 35 U.S.C. 154(b) by 0 days.

(21) Appl. No.: 15/361,025

(22) Filed: Nov. 24, 2016

(65) Prior Publication Data
US 2017/0147086 A1 May 25, 2017

Related U.S. Application Data (60) Provisional application No. 62/259,689, filed on Nov. 25, 2015.

(30) Foreign Application Priority Data

Nov. 9, 2016 (TW) .............................. 105136441 A (51) Int. Cl.
G06F 3/02 (2006.01)
G09G 5/00 (2006.01)
G06F 3/023 (2006.01)

(52) U.S. Cl.
CPC .................................. *G06F 3/0233* (2013.01)

(58) Field of Classification Search
CPC .................................................... G06F 3/0233
See application file for complete search history.

(56) References Cited

U.S. PATENT DOCUMENTS

| | | | |
|---|---|---|---|
| 4,303,907 | A | 12/1981 | Wilson |
| 4,633,228 | A | 12/1986 | Larson |
| 5,386,584 | A | 1/1995 | Verstegen et al. |
| 6,424,274 | B1 | 7/2002 | Schnizlein et al. |
| 6,831,630 | B2 | 12/2004 | Mamata |

(Continued)

FOREIGN PATENT DOCUMENTS

| | | |
|---|---|---|
| EP | 1433254 B1 | 11/2008 |
| TW | 200737253 | 10/2007 |

(Continued)

OTHER PUBLICATIONS

TIPO Notice of Allowance dated Nov. 28, 2017 in corresponding Taiwain application (No. 105136441).

*Primary Examiner* — Insa Sadio
(74) *Attorney, Agent, or Firm* — McClure, Qualey & Rodack, LLP (57) ABSTRACT

A keyboard device includes M driving circuits DC(1)~DC (M), N transition circuits TC(1)~TC(N), a control module, M column signal lines C(1)~C(M), N row signal lines R(1)~R(N) and M*N key units KU(1,1)~KU(M,N). The control module performs a scanning process to sequentially scan the M column signal lines C(1)~C(M) in M scan cycles scan(1)~scan(M). If the key unit KU(k,x) connected with the k-th column signal line C(k) and the x-th row signal line R(x) is depressed, a scan voltage is transmitted from the k-th column signal line C(k) to the x-th row signal line R(x) through a switch sw(k,x) of the key unit KU(k,x). The transition circuit TC(x) connected with the x-th row signal line R(x) is turned on according to the scan voltage. Consequently, an output voltage Rout(x) from the transition circuit TC(x) has a first voltage level.

8 Claims, 9 Drawing Sheets

(56) References Cited

U.S. PATENT DOCUMENTS

| 6,992,600 B2 | 1/2006 | Lu |
| 8,754,790 B2 | 6/2014 | Lin |
| 2010/0066567 A1 | 3/2010 | Dietz et al. |

FOREIGN PATENT DOCUMENTS

| TW | M365500 U1 | 9/2009 |
| TW | 201037564 A | 10/2010 |
| TW | 201401106 A | 1/2014 |

KEYBOARD DEVICE

CROSS REFERENCE TO RELATED PATENT APPLICATION

This application claims priority to U.S. Provisional Patent Application No. 62/259,689 filed Nov. 25, 2015, and claims the benefit of Taiwan application Serial No. 105136441, filed Nov. 9, 2016, the contents of which are incorporated herein by reference.

FIELD OF THE INVENTION

The present invention relates to a keyboard device, and more particularly to a keyboard device with an anti-ghosting function.

BACKGROUND OF THE INVENTION

Conventionally, the keys of a keyboard device are arranged in a keyboard matrix. Since the number of conductor lines used in the keyboard matrix is not very large, the fabricating cost of the keyboard device is reduced and the assembling complexity is simplified. However, the conventional keyboard device usually has a ghosting problem.

FIGS. 1A~1D schematically illustrate some situations of generating the ghosting problem in a keyboard matrix. As shown in the drawings, two column signal lines C(1), C(2) and two row signal lines R(1), R(2) of the keyboard matrix extending across each other two define four key units KU(1,1), KU(1,2), KU(2,1) and KU(2,2). The key unit KU(1,1) is connected with the first column signal line C(1) and the first row signal line R(1). The key unit KU(1,2) is connected with the first column signal line C(1) and the second row signal line R(2). The key unit KU(2,1) is connected with the second column signal line C(2) and the first row signal line R(1). The key unit KU(2,2) is connected with the second column signal line C(2) and the second row signal line R(2). In the drawings, the solid dots indicate the depressed key units, and the open dot indicates the non-depressed key. When one of the key units is depressed, the column signal line and the row signal line connected with the depressed key unit are electrically conducted. For example, if the key unit KU(1,1) is depressed, the first column signal line C(1) and the first row signal line R(1) are electrically conducted.

A keyboard controller (not shown) will sequentially scan the column signal lines and detect the voltage levels of all row signal lines. In case that the keyboard controller issues a scan signal to the first column signal line C(1) and the key unit KU(1,1) is depressed, the keyboard controller determines that the key unit KU(1,1) is depressed according to the high level state of the first row signal line R(1).

Figure 1A:
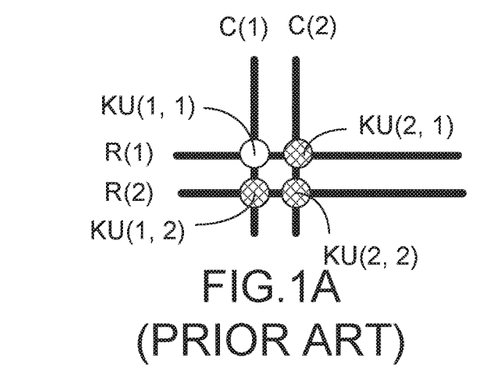
FIGS. 1A~1D (prior art) schematically illustrate some situations of generating the ghosting problem in a keyboard matrix.

In the situation of FIG. 1A, the key unit KU(1,1) is not depressed, but the other key units KU(1,2), KU(2,1) and KU(2,2) are depressed. When the keyboard controller issues a scan signal to the first column signal line C(1), the first row signal line R(1) is in the high level state through the key units KU(1,2), KU(2,1) and KU(2,2). Under this circumstance, the keyboard controller erroneously determines that the key unit KU(1,1) is depressed according to the high level state of the first row signal line R(1).

Figure 1B:
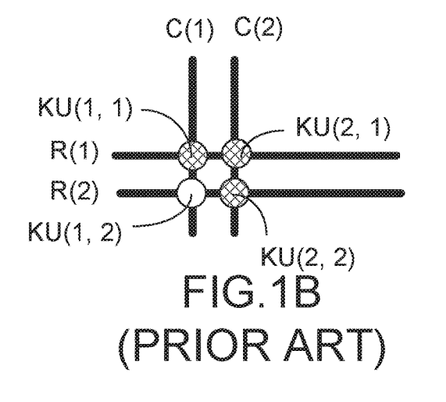
Figure 1C:
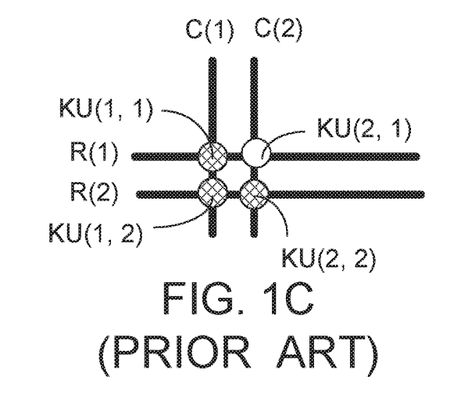
Figure 1D:
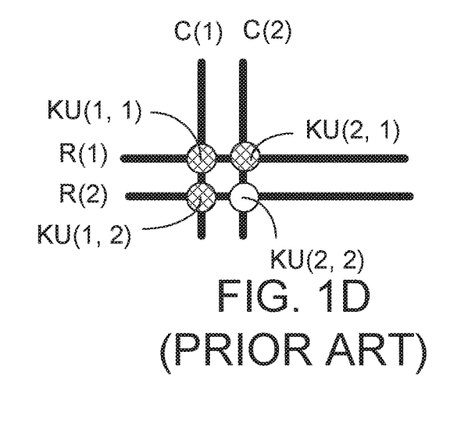

In the situation of FIG. 1A, the key unit KU(1,1) is erroneously determined as a depressed key. In the situation of FIG. 1B, the key unit KU(1,2) is erroneously determined as a depressed key. In the situation of FIG. 1C, the key unit KU(2,1) is erroneously determined as a depressed key. In the situation of FIG. 1D, the key unit KU(2,2) is erroneously determined as a depressed key. The erroneously-determined keys are called ghost keys.

As mentioned above, the keyboard controller may erroneously determines that a specified key unit is depressed when the specified key unit is not depressed but the neighboring key units are depressed. Under this circumstance, the ghosting problem occurs.

Therefore, there is a need of providing a keyboard device with an anti-ghosting function.

SUMMARY OF THE INVENTION

The present invention provides a keyboard device with an anti-ghosting function.

An embodiment of the present invention provides a keyboard device. The keyboard device includes M driving circuits DC(1)~DC(M), N transition circuits TC(1)~TC(N), a control module, M column signal lines C(1)~C(M), and N row signal, wherein M and N are positive integers. The control module includes N input ports and M output ports. The N input ports are electrically coupled to the N transition circuits TC(1)~TC(N) respectively, and the M output ports are electrically coupled to the M driving circuits DC(1)~DC(M) respectively. The M column signal lines C(1)~C(M) are electrically coupled to the M driving circuits DC(1)~DC(M), respectively, and the N row signal lines R(1)~R(N) are electrically coupled to the N transition circuits TC(1)~TC(N), respectively. Moreover, M*N intersections are formed by the N row signal lines R(1)~R(N) extending across the M column signal lines C(1)~C(M); and the M*N key units KU(1,1)~KU(M,N) are disposed neighboring to the M*N intersections, respectively. A key unit KU(i,j) of the M*N key units KU(1,1)~KU(M,N) includes a switch sw(i,j). A first end of the switch sw(i,j) is connected with a column signal line C(i), and a second end of the switch sw(i,j) is connected with a row signal line R(j). wherein i is a positive integer smaller than or equal to M and represents which column signal line the switch sw(i,j) is connected, and j is a positive integer smaller than or equal to N and represents which row signal line the switch sw(i,j) is connected. When the key unit KU(i,j) is depressed, the column signal line C(i) and the row signal line R(j) are electrically coupled to each other through the switch sw(i,j). The control module performs a scanning process to sequentially scan the M column signal lines C(1)~C(M) in M scan cycles scan(1)~scan(M), and the scanning process includes following steps. In a step (a), an initial value of k is set, wherein the initial value of k is a positive integer smaller than or equal to M. In a step (b), a scan cycle scan(k) is entered. The step (b) includes steps (b1) and (b2). In the step (b1), a scan voltage is provided to the k-th column signal line C(k) and an un-scan voltage is provided to the column signal lines C(1)~C(k−1) and C(k+1)~C(M) through the M output ports, wherein a voltage level of the un-scan voltage is lower than a voltage level of the scan voltage. In the step (b2), whether N key units KU(k, 1)~KU(k,N) connected with the k-th column signal line C(k) are conducted through the N transition circuits TC(1)~TC(N) are determined. When a key unit KU(k,x) connected with the k-th column signal line C(k) and the x-th row signal line R(x) is depressed, the scan voltage is transmitted from the k-th column signal line C(k) to the x-th row signal line R(x) through a switch sw(k,x) of the key unit KU(k,x), and the transition circuit TC(x) is turned on by the scan voltage, so that an output voltage Rout(x) from the transition circuit TC(x) has a first voltage level. wherein x is a positive integer smaller than or equal to N. When a key unit KU(m, x)

connected with the m-th column signal line C(m) and the x-th row signal line R(x) is depressed, the un-scan voltage is transmitted from the m-th column signal line C(m) to the x-th row signal line R(x) through a switch sw(m, x) of the key unit KU(m, x), wherein m is a positive integer smaller than or equal to M, and m is not equal to k. If the transition circuit TC(x) is turned on, the control module determines that the key unit KU(k,x) is depressed. If the transition circuit TC(x) is turned off, the control module determines that the key unit KU(k,x) is not depressed. In a step (c), the step (b1) and the step (b2) are repeatedly performed according to an updated k corresponding to the un-scanned column signal lines until all of the column signal lines C(1)~C(M) have been scanned once.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 2:
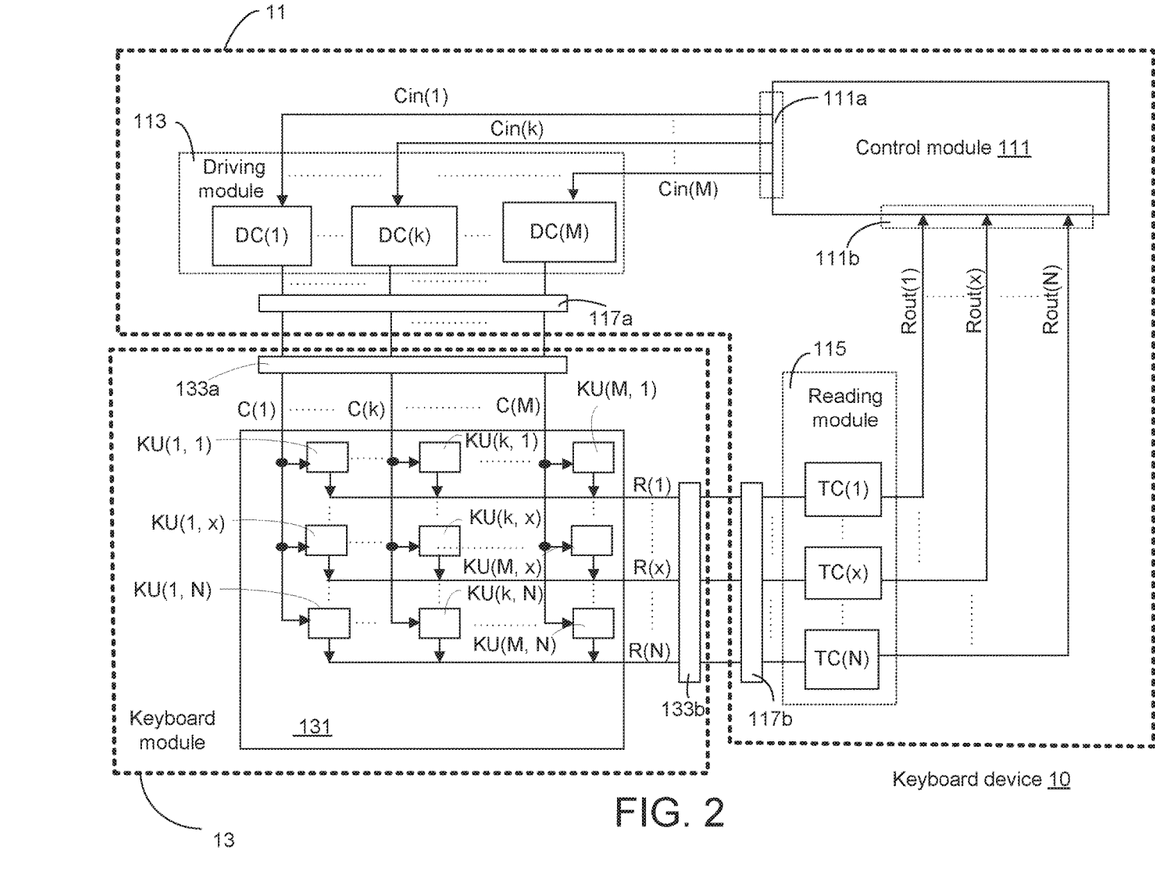
FIG. 2 is a schematic circuit block diagram illustrating a keyboard device with an anti-ghosting function according to an embodiment of the present invention.
Figure 4:
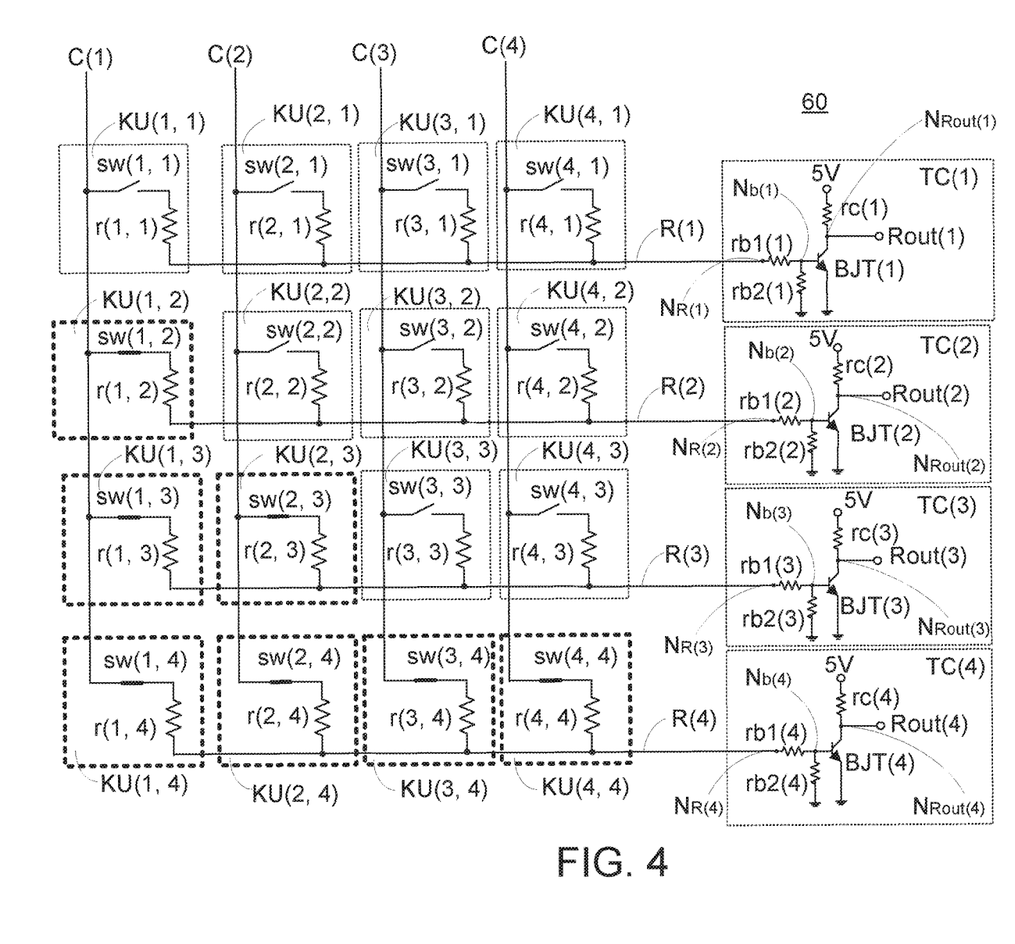
FIG. 4 is a schematic detailed circuit diagram illustrating a 4*4 keyboard matrix and transition circuits of the keyboard device according to the embodiment of the present invention.

Please refer to FIG. 2 and FIG. 4. FIG. 2 is a schematic circuit block diagram illustrating a keyboard device with an anti-ghosting function according to an embodiment of the present invention. FIG. 4 is a schematic detailed circuit diagram illustrating a 4*4 keyboard matrix and transition circuits of the keyboard device according to the embodiment of the present invention.

The keyboard device 10 includes a keyboard module 13, a driving module 113, a control module 111 and a reading module 115. The keyboard module 13 includes a keyboard matrix 131 that is composed of M*N key units KU(1,1) ~KU(M, N). These key units KU(1,1)~KU(M, N) are installed on a membrane circuit board. Since the area of the membrane circuit board is limited, these other main components (for example, the driving module 113, the control module 111 and the reading module 115) are installed on a motherboard 11.

As shown in FIG. 2, the driving module 113 includes M driving circuits DC(1)~DC(M), and the reading module 115 includes N transition circuits TC(1)~TC(N). Two first connectors 117a and 117b are also installed on the motherboard 11. The keyboard module 13 includes two second connectors 133a, 133b, M column signal lines C(1)~C(M), N row signal lines R(1)~R(N) and the M*N key units KU(1,1)~KU(M, N). The first connectors 117a and 117b can be combined together or separated from each other. Similarly, the two second connectors 133a and 133b can be combined together or separated from each other. When the keyboard module 13 is assembled with the motherboard 11, the first connector 117a and the second connector 133a are connected with each other, and the first connector 117b and the second connector 133b are connected with each other. Consequently, the M driving circuits DC(1)~DC(M) are electrically coupled to the M column signal lines C(1)~C(M), and the N transition circuits TC(1)~TC(N) are electrically coupled to the N row signal lines R(1)~R(N).

Moreover, the control module 11 further includes N input ports 111b and M output ports 111a. The M output ports 111a are electrically coupled to the M driving circuits DC(1)~DC(M) through M column input lines Cin(1)~Cin(M). The M driving circuits DC(1)~DC(M) are electrically coupled to the keyboard matrix 131 through the M column signal lines C(1)~C(M). The control module 111 is electrically coupled to the transition circuits TC(1)~TC(N) of the reading module 115 through N row read lines. The transition circuits TC(1)~TC(N) are also electrically coupled to the keyboard matrix 131 through the N row signal lines R(1)~R(N). The M column signal lines C(1)~C(M) and the N row signal lines R(1)~R(N) extend across each other to define the M*N key units KU(1,1)~KU(M, N) of the keyboard matrix 131. The operations of the keyboard matrix and the transition circuits will be described in FIG. 4.

The control module 111 issues M column output signals to the M driving circuits DC(1)~DC(M) through the M column input lines Cin(1)~Cin(M). The driving circuits DC(1)~DC(M) selectively issue a scan voltage $V_{scan}$ (for example, 5V) or an un-scan voltage $V_{un-scan}$ (for example, 0V) to the corresponding key units through the corresponding column signal lines C(1)~C(M). For example, in case that a column output signal in a high level state is transmitted from the control module 111 to the driving circuit DC(1) through the column input line Cin(1), the driving circuit DC(1) issues the scan voltage $V_{scan}$ to the key units KU(1,1), KU(1, x), . . . , and KU(1, N) through the column signal line C(1). Whereas, in case that a column output signal in a low level state is transmitted from the control module 111 to the driving circuit DC(1) through the column input line Cin(1), the driving circuit DC(1) issues the un-scan voltage $V_{un-scan}$ to the key units KU(1,1), KU(1, x), . . . , and KU(1, N) through the column signal line C(1).

During the k-th scan cycle, the control module 111 scan the key units KU(k, 1), KU(k,x), . . . , and KU(k, N) through the k-th column signal line C(k). That is, the control module 111 selects the k-th driving circuit DC(k) to issue the scan voltage $V_{scan}$, and allows the other driving circuits DC(1)~DC(k−1) and DC(k+1)~DC(M) to issue the un-scan voltage $V_{un-scan}$, wherein k is an integer between 1 and M. After the voltages of the row signal lines R(1)~R(N) are received by the transition circuits TC(1)~TC(N), the transition circuits TC(1)~TC(N) generate different output voltages Rout(1)~Rout(N) to the row read lines according to the voltages of the row signal lines R(1)~R(N). According to the output voltages Rout(1)~Rout(N) from the transition circuits TC(1)~TC(N) of the reading module 115, the control module 111 determines whether the key units of the keyboard matrix 131 are electrically conducted.

For example, the control module 111 determines whether the key unit KU(k,x) is electrically conducted or shut off according to the output voltage Rout(x). The way of determining whether the key unit KU(k,x) is electrically conducted or shut off by the transition circuit TC(x) will be described in FIG. 5.

Figure 3:
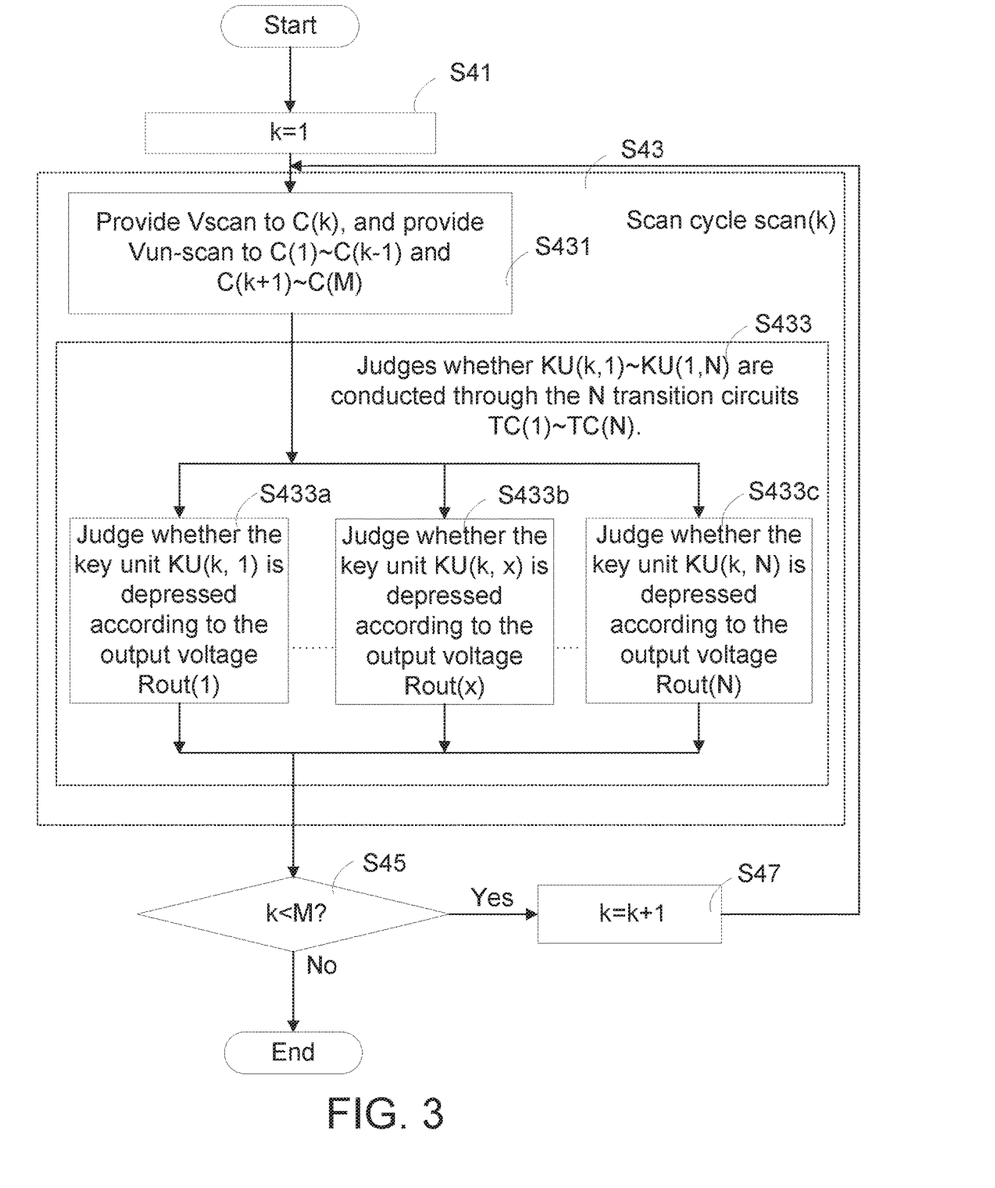
FIG. 3 is a flowchart illustrating a method for sequentially scanning the column signal lines of the keyboard device according to an embodiment of the present invention.

FIG. 3 is a flowchart illustrating a method for sequentially scanning the column signal lines of the keyboard device according to an embodiment of the present invention. In accordance with the present invention, the control module 111 controls the M driving circuits DC(1)~DC(M) to sequentially scan the M column signal lines C(1)~C(M) in M scan cycles scan(1)~scan(M).

In a step S41, an initial value of k is set, wherein k is a positive integer smaller than or equal to M. For example, the initial value of k is set as 1.

In a step S43, a key units KU(k,1)~KU(1,N) connected with the k-th column signal line C(k) are scanned in the k-th scan cycle scan(k). The step S43 includes two sub-steps S431 and S433.

In the step S431, the control module 111 controls the M driving circuits DC(1)~DC(M) through the output ports 111a. Consequently, the k-th output port provides the scan voltage $V_{scan}$ to the k-th column signal line C(k). In addition, the other output ports provide the un-scan voltage $V_{un-scan}$ to the column signal lines C(1)~C(k−1) and C(k+1)~C(M). The voltage level of the un-scan voltage $V_{un-scan}$ is lower than the voltage level of the scan voltage $V_{scan}$.

In the step S433, the control module 111 determines whether the key units KU(k,1)~KU(1,N) connected with the k-th column signal line C(k) are conducted or shut off through the N transition circuits TC(1)~TC(N). For example, the transition circuits TC(1), TC(x) and TC(N) generate the output voltages Rout(1), Rout(x) and Rout(N) to the corresponding row read lines, respectively. According to the voltage levels of the output voltages Rout(1), Rout(x) and Rout(N), the control module 111 determines whether the key units KU(k,1), KU(k,x) and KU (k,N) are depressed (Steps S433a, S433b and S433c). The way of generating the output voltages Rout(1)~Rout(N) from the transition circuits TC(1)~TC(N) will be described in FIGS. 4, 5 and 6.

After the scan cycle scan(k) is ended, the step S45 is performed to determine whether k is smaller than M. If the determining condition of the step S45 is satisfied, k is set as k+1 (Step S47) and the steps S431 and S433 are repeatedly done according to the updated k. If the determining condition of the step S45 is not satisfied, it means that all of the M column signal lines C(1)~C(M) have been scanned. Meanwhile, the flowchart is ended.

The way of updating the variable k is not restricted as long as the updated k is correlated to the un-scanned column signal lines. Similarly, the steps S431 and S433 are repeatedly done according to the updated k until all of the column signal lines C(1)~C(M) have been scanned once.

Please refer to FIG. 4. The key units in different rows have different situations. In the first row, all of the key units KU(1,1)~KU(4, 1) are not depressed. In the second row, the key unit KU(1,2) is depressed, but the key units KU(2,2)~KU(4, 2) are not depressed. In the third row, the key units KU(1, 3) and KU(2, 3) are depressed, but the key units KU(3, 3) and KU(4, 3) are not depressed. In the fourth row, all of the key units KU(1,4)~KU(4,4) are depressed.

In accordance with the present invention, the control module 111 determines whether the key units KU(1,1)~KU(M,N) are depressed or undepressed individually.

Figure 5:
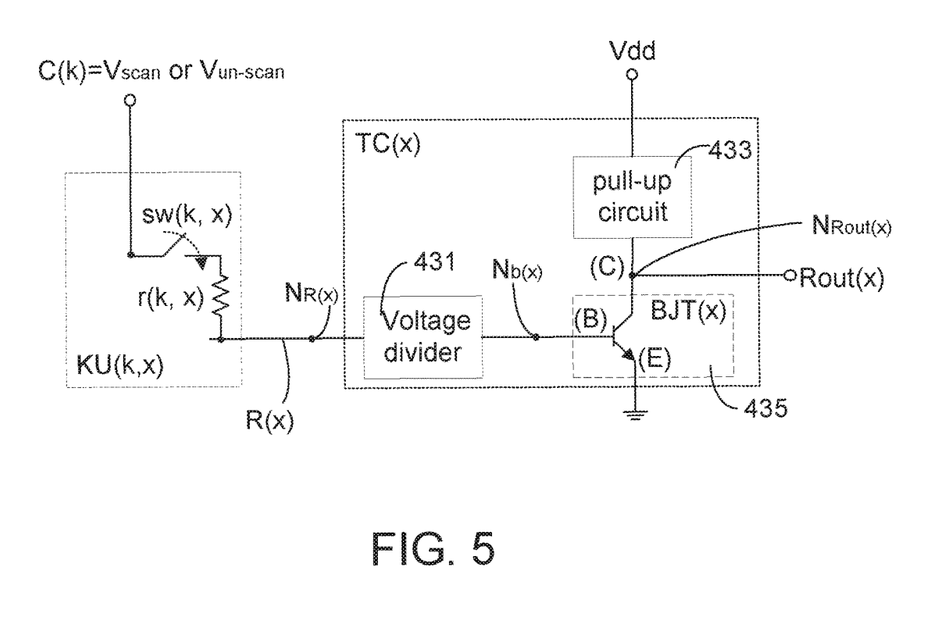
FIG. 5 is a schematic circuit diagram illustrating the relationship between a key unit KU(k,x) and the corresponding transition circuit TC(x)

FIG. 5 is a schematic circuit diagram illustrating the relationship between a key unit KU(k,x) and the corresponding transition circuit TC(x). The key unit KU(k,x) is one of the plural key units as shown in FIGS. 2 and 4. The key unit KU(k,x) is connected with the column signal line C(k) and the transition circuit TC(x). The control module 111 determines whether the key unit KU(k,x) is depressed according to the output voltage from the transition circuit TC(x).

As shown in FIG. 5, the key unit KU(k,x) includes a switch sw(k,x) and a resistor r(k,x). A first end of the switch sw(k,x) is connected with the column signal line C(k). A second end of the switch sw(k,x) is connected with the row signal line R(x). The column signal line C(k) receives the scan voltage $V_{scan}$ or the un-scan voltage $V_{un-scan}$. When the key unit KU(k,x) is depressed, the switch sw(k,x) is turned on. Consequently, the column signal line C(k) and the row signal line R(x) are electrically coupled to each other.

The transition circuit TC(x) includes a voltage divider 431, a switching circuit 435 and a pull-up circuit 433. A high supply voltage source Vdd is connected with a row read node $N_{Rout(x)}$ through the pull-up circuit 433. The voltage divider 431 is electrically coupled to the row signal line R(x). Moreover, the voltage divider 431 generates a voltage at a comparison node $N_{b(x)}$ according to a voltage of the row signal line R(x). The on/off state of the switching circuit 435 is determined according to the voltage at the comparison node $N_{b(x)}$.

An example of the switching circuit 435 includes an NPN-type bipolar junction transistor BJT(x). The base B(x) of the bipolar junction transistor BJT(x) is connected with the row signal line R(x). The emitter E(x) of the bipolar junction transistor BJT(x) is connected with a ground terminal (Gnd). The collector C(x) of the bipolar junction transistor BJT(x) is connected with the high supply voltage source Vdd and a k-th input port. When the bipolar junction transistor BJT(x) is turned on, the output voltage Rout(x) in the low voltage state (that is, a first voltage level) is outputted from the transition circuit TC(x). When the bipolar junction transistor BJT(x) is turned off, the output voltage Rout(x) in the high voltage state (that is, a second voltage level) is outputted from the transition circuit TC(x).

The switching circuit 435 is not restricted to the NPN-type bipolar junction transistor BJT(x). For example, in another embodiment, the switching circuit 435 includes a metal-oxide-semiconductor field-effect transistor (MOSFET), a NOT gate or any other comparable component. It is noted that the voltage level and the current direction may be varied according to the employed components. For example, an inversed voltage level may be used for performing the driving action and the reading action.

Figure 6:
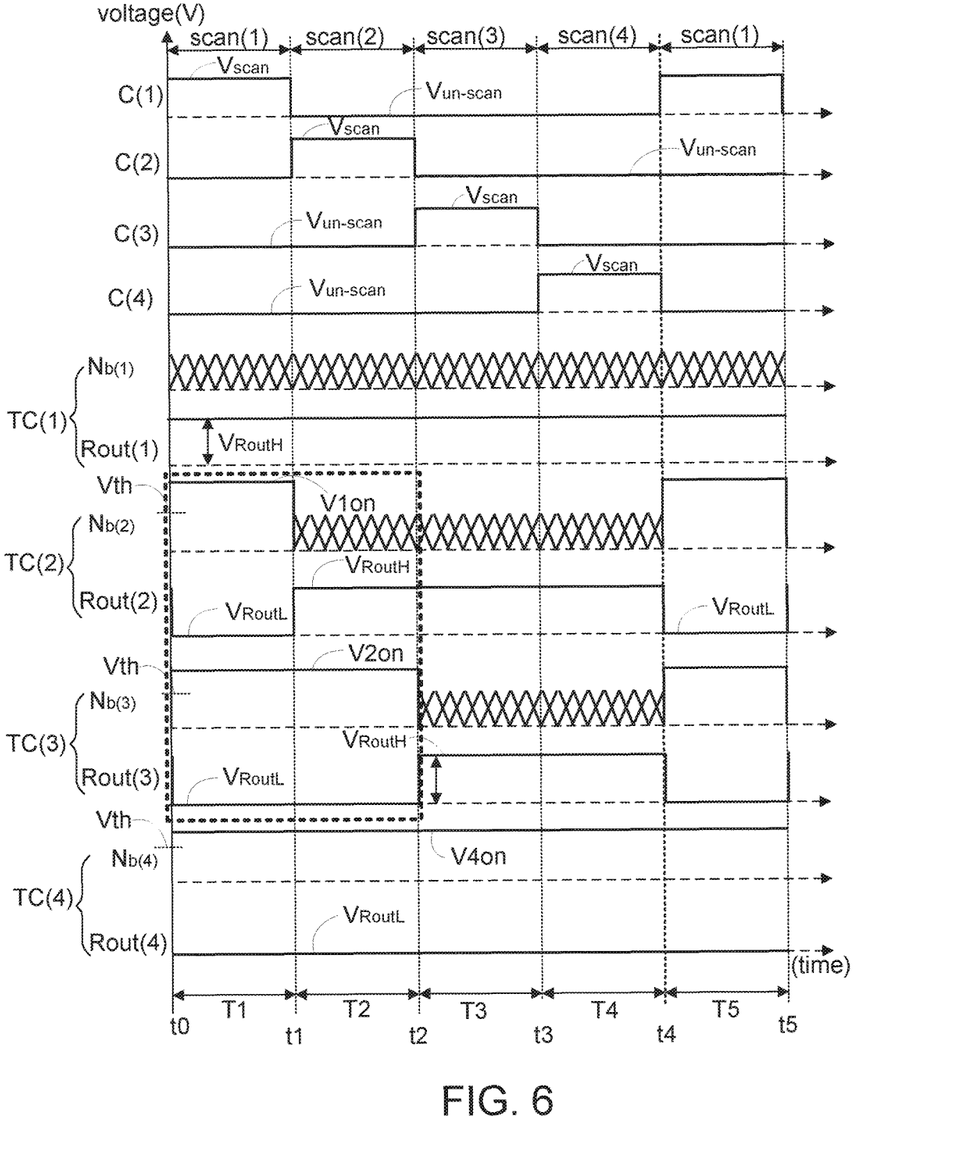
FIG. 6 is a schematic waveform diagram illustrating associated signals processed by the keyboard device as shown in FIG. 4.

FIG. 6 is a schematic waveform diagram illustrating associated signals processed by the keyboard device as shown in FIG. 4. From top to bottom, the voltage signals in the vertical axis are sequentially the voltage signal of the column signal line C(1), the voltage signal of the column signal line C(2), the voltage signal of the column signal line C(3), the voltage signal of the column signal line C(4), the voltage at the comparison node $N_{b(1)}$, the output voltage Rout(1), the voltage at the comparison node $N_{b(2)}$, the output voltage Rout(2), the voltage at the comparison node $N_{b(3)}$, the output voltage Rout(3), the voltage at the comparison node $N_{b(4)}$ and the output voltage Rout(4).

The time period between the time point t0 and the time point t1 is a first time interval T1. The time period between the time point t1 and the time point t2 is a second time interval T2. The time period between the time point t2 and the time point t3 is a third time interval T3. The time period between the time point t3 and the time point t4 is a fourth time interval T4. The time period between the time point t4 and the time point t5 is a fifth time interval T5. Each time period is equal to the time length of one scan cycle. During the scan cycles scan(1)~scan(4), the control module 111 controls the driving circuits DC(1)~DC(4) to scan the column signal lines C(1)~C(4). After the scan cycles scan(1)~scan(4), the control module 111 performs the above scanning process again. That is, the voltage signals in the fifth time interval T5 is identical to the voltage signals in the first time interval T1. The way of generating the output voltages Rout(1)~Rout(4) from the transition circuits TC(1)~TC(4) in response to the depressed or undepressed state of the key unit will be described as follows.

First of all, the changes of the associated signals in the scan cycle scan(1) are described. In the scan cycle scan(1), the scan voltage $V_{scan}$ (for example, 5V) is provided to the column signal line C(1), and the un-scan voltage $V_{un\text{-}scan}$ (for example, 0V) is provided to the column signal lines C(2)~C(4). The scan voltage $V_{scan}$ is transmitted from the column signal line C(1) to the key units KU(1,1)~KU(1,4). By reading the output voltages Rout(1)~Rout(4) from the transition circuits TC(1)~TC(4), the control module 111 determines whether the key units KU(1,1)~KU(1,4) are depressed or undepressed.

Since the key unit KU(1,1) is not depressed, the scan voltage $V_{scan}$ from the column signal line C(1) cannot be transmitted to the transition circuit TC(1). Under this circumstance, the comparison node $N_{b(1)}$ is in a floating state, and the transistor BJT(1) is turned off. Since the transistor BJT(1) is turned off, the output voltage Rout(1) is in the high level state $V_{RoutH}$. Since the key unit KU(1,2) is depressed, the scan voltage $V_{scan}$ from the column signal line C(1) is transmitted to the comparison node $N_{b(2)}$ through the switch sw(1,2), the resistor r(1,2) and the voltage divider. Meanwhile, the voltage of the comparison node $N_{b(2)}$ is higher than the threshold voltage Vth of the transistor BJT(2), and the transistor BJT(2) is turned on. Since the transistor BJT(2) is turned on, the output voltage Rout(2) is in the low level state $V_{RoutL}$. Since the key unit KU(1,3) is depressed, the scan voltage $V_{scan}$ from the column signal line C(1) is transmitted to the comparison node $N_{b(3)}$ through the switch sw(1,3), the resistor r(1,3) and the voltage divider. Meanwhile, the voltage of the comparison node $N_{b(3)}$ is higher than the threshold voltage Vth of the transistor BJT(3), and the transistor BJT(3) is turned on. Since the transistor BJT(3) is turned on, the output voltage Rout(3) is in the low level state $V_{RoutL}$. Since the key unit KU(1,4) is depressed, the scan voltage $V_{scan}$ from the column signal line C(1) is transmitted to the comparison node $N_{b(4)}$ through the switch sw(1,4), the resistor r(1,4) and the voltage divider. Meanwhile, the voltage of the comparison node $N_{b(4)}$ is higher than the threshold voltage Vth of the transistor BJT(4), and the transistor BJT(4) is turned on. Since the transistor BJT(4) is turned on, the output voltage Rout(4) is in the low level state $V_{RoutL}$.

In the first column of key units KU(1,1)~KU(1,4) of FIG. 4, the key unit KU(1,1) is shut off, but the key units KU(1,2)~KU(1,4) are conducted. Consequently, the output voltage Rout(1) from the transition circuit TC(1) is in the high level state $V_{RoutH}$, and the output voltages Rout(2)~Rout(4) from the transition circuit TC(2)~TC(4) are in the low level state $V_{RoutL}$. According to the voltage levels of the output voltages Rout(1)~Rout(4) in the scan cycle scan(1), the control module 111 can determine whether the key units KU(1,1)~KU(1,4) are depressed or undepressed.

In the scan cycle scan(1), the voltages of the comparison nodes $N_{b(2)}$, $N_{b(3)}$ and $N_{b(4)}$ are all higher than the threshold voltage Vth. However, the voltages of the comparison nodes $N_{b(2)}$, $N_{b(3)}$ and $N_{b(4)}$ are somewhat different. For example, the voltage of the comparison node $N_{b(2)}$ is higher than the voltage of the comparison node $N_{b(3)}$, and the voltage of the comparison node $N_{b(3)}$ is higher than the voltage of the comparison node $N_{b(4)}$. The reason will be described later in FIGS. 7, 8A and 8B.

Then, the changes of the associated signals in the scan cycle scan(2) are described. In the scan cycle scan(2), the scan voltage $V_{scan}$ (for example, 5V) is provided to the column signal line C(2), and the un-scan voltage $V_{un\text{-}scan}$ (for example, 0V) is provided to the column signal lines C(1), C(3) and C(4). The scan voltage $V_{scan}$ is transmitted from the column signal line C(2) to the key units KU(2,1)~KU(2,4). By reading the output voltages Rout(1)~Rout(4) from the transition circuits TC(1)~TC(4), the control module 111 determines whether the key units KU(2,1)~KU(2,4) are depressed or undepressed.

Since the key unit KU(2,1) is not depressed, the scan voltage $V_{scan}$ from the column signal line C(2) cannot be transmitted to the transition circuit TC(1). Under this circumstance, the comparison node $N_{b(1)}$ is in the floating state, and the transistor BJT(1) is turned off. Since the transistor BJT(1) is turned off, the output voltage Rout(1) is in the high level state $V_{RoutH}$. Since the key unit KU(2,2) is not depressed, the scan voltage $V_{scan}$ from the column signal line C(2) cannot be transmitted to the transition circuit TC(2). Under this circumstance, the comparison node $N_{b(2)}$ is in the floating state, and the transistor BJT(2) is turned off. Since the transistor BJT(2) is turned off, the output voltage Rout(2) is in the high level state $V_{RoutH}$. Since the key unit KU(2,3) is depressed, the scan voltage $V_{scan}$ from the column signal line C(2) is transmitted to the comparison node $N_{b(3)}$ through the switch sw(2,3), the resistor r(2,3) and the voltage divider. Meanwhile, the voltage of the comparison node $N_{b(3)}$ is higher than the threshold voltage Vth of the transistor BJT(3), and the transistor BJT(3) is turned on. Since the transistor BJT(3) is turned on, the output voltage Rout(3) is in the low level state $V_{RoutL}$. Since the key unit KU(2,4) is depressed, the scan voltage $V_{scan}$ from the column signal line C(2) is transmitted to the comparison node $N_{b(4)}$ through the switch sw(2,4), the resistor r(2,4) and the voltage divider. Meanwhile, the voltage of the comparison node $N_{b(4)}$ is higher than the threshold voltage Vth of the transistor BJT(4), and the transistor BJT(4) is turned on. Since the transistor BJT(4) is turned on, the output voltage Rout(4) is in the low level state $V_{RoutL}$.

In the scan cycle scan(3), the scan voltage $V_{scan}$ (for example, 5V) is provided to the column signal line C(3), and the un-scan voltage $V_{un\text{-}scan}$ (for example, 0V) is provided to the column signal lines C(1), C(2) and C(4). The scan voltage $V_{scan}$ is transmitted from the column signal line C(3)

to the key units KU(3,1)~KU(3,4). By reading the output voltages Rout(1)~Rout(4) from the transition circuits TC(1)~TC(4), the control module 111 determines whether the key units KU(3,1)~KU(3,4) are depressed or undepressed. The method of determining whether the key units KU(3,1)~KU(3,4) are depressed or undepressed according to the output voltages Rout(1)~Rout(4) from the transition circuits TC(1)~TC(4) in the scan cycle scan(3) is similar to the above method, and is not redundantly described herein.

In the scan cycle scan(4), the scan voltage $V_{scan}$ (for example, 5V) is provided to the column signal line C(4), and the un-scan voltage $V_{un-scan}$ (for example, 0V) is provided to the column signal lines C(1), C(2) and C(3). The scan voltage $V_{scan}$ is transmitted from the column signal line C(4) to the key units KU(4,1)~KU(4,4). By reading the output voltages Rout(1)~Rout(4) from the transition circuits TC(1)~TC(4), the control module 111 determines whether the key units KU(3,1)~KU(3,4) are depressed or undepressed. The method of determining whether the key units KU(4,1)~KU(4,4) are depressed or undepressed according to the output voltages Rout(1)~Rout(4) from the transition circuits TC(1)~TC(4) in the scan cycle scan(3) is similar to the above method, and is not redundantly described herein.

The relative locations of the key units KU(1,2), KU(2,2), KU(1,3) and KU(2,3) of FIG. 4 are similar to the relative locations of the key units of FIG. 1C. In FIG. 6, the signals associated with the transition circuits TC(2) and TC(3) are circumscribed with a dotted frame. The voltage levels of the output voltages corresponding to the depressed or undepressed states of the key units KU(1,2), KU(2,2), KU(1,3) and KU(2,3) can be realized according to these signals. In the scan cycle scan(1), the control module 111 determines that the key units KU(1,2) and KU(1,3) are conducted according to the output voltages Rout(2) and Rout(3) (that is, in the low level state $V_{RoutL}$). In the scan cycle scan(2), the control module 111 determines that the key unit KU(2,2) is shut off and KU(2,3) is conducted according to the high level state $V_{RoutH}$ of the output voltage Rout(2) and the low level state $V_{RoutL}$ of the output voltage Rout(3).

Please refer to FIG. 4 again. When the scan voltage $V_{scan}$ (for example, 5V) is provided to the column signal line C(2), the current sequentially flows from the column signal line C(2) to the column signal line C(1) through the key units KU(2,3) and KU(1,3) because the column signal line C(1) is issued with the un-scan voltage (for example, 0V). Because the column signal line C(1) is biased and maintained at the un-scan voltage, the current originated from the scan voltage $V_{scan}$ is incapable of changing voltage level of the column signal line C(1). Consequentially, even if the key unit KU(1,2) is depressed and conducted so that the un-scan voltage is passed to the row signal line R(2), the voltage of the comparison node $N_{b(2)}$ is not affected. Consequently, the transistor BJT(2) of the transition circuit TC(2) is turned off. Under this circumstance, the control module 111 can accurately determine that the key unit KU(2,2) is in the undepressed state according to the off state of the transition circuit TC(2). Consequently, the anti-ghosting purpose can be achieved.

Figure 7:
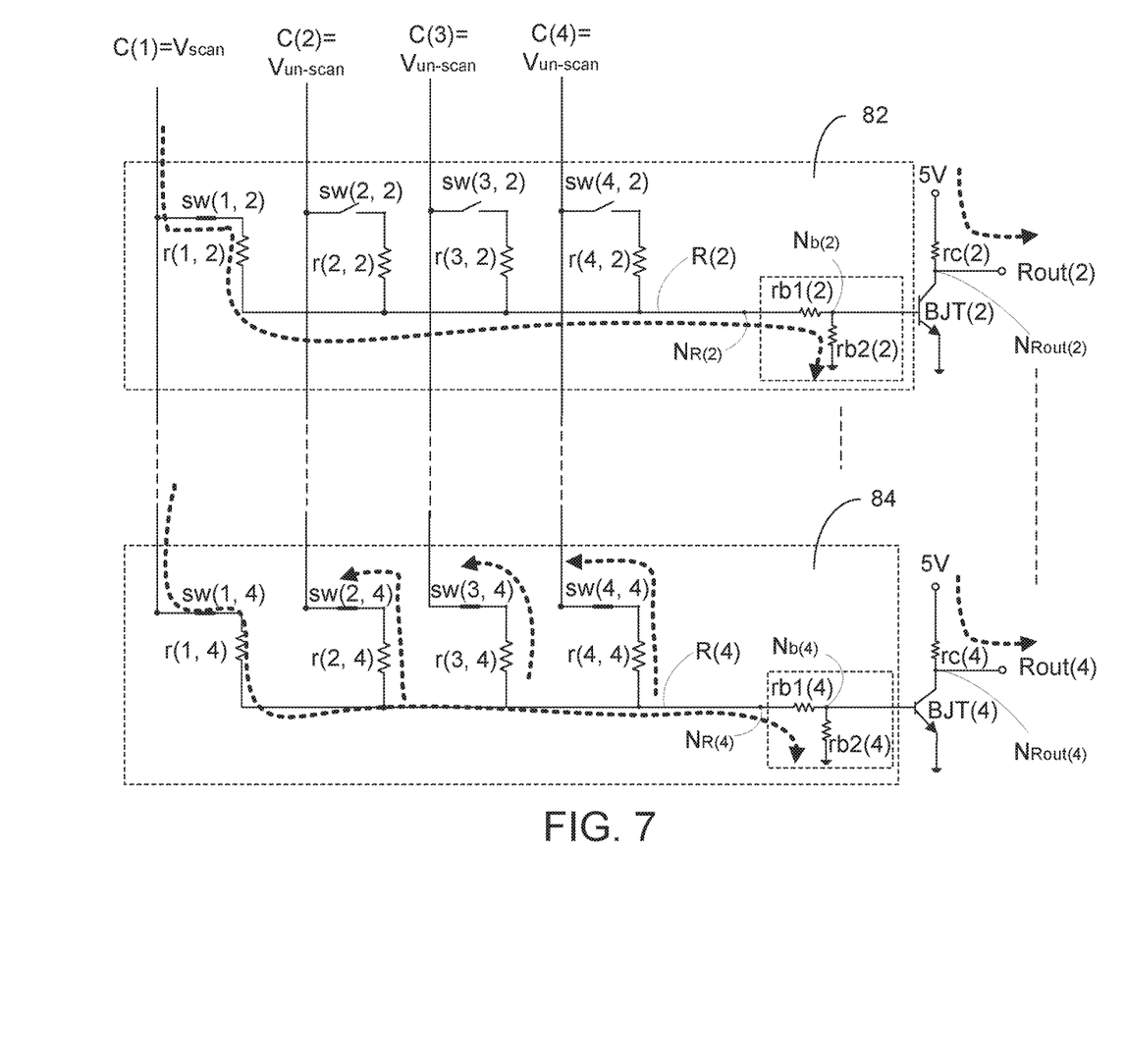
FIG. 7 is a schematic circuit diagram illustrating the currents flowing through the second row of key units, the fourth row of key units and the corresponding transition circuits in the scan cycle scan(1)

FIG. 7 is a schematic circuit diagram illustrating the currents flowing through the second row of key units, the fourth row of key units and the corresponding transition circuits in the scan cycle scan(1). In the upper side of FIG. 7, the key units KU(1,2)~KU(4,2) and the transition circuit TC(2) are shown. In the lower side of FIG. 7, the key units KU(1,4)~KU(4,4) and the transition circuit TC(4) are shown. For describing the direction of the current, the switches and resistors in these key units are shown.

In the scan cycle scan(1), the current flows from the high-level column signal line C(1) to a row node $N_{R(2)}$ through the switch sw(1,2) and the resistor r(1,2) of the key unit KU(1,2), and then the current flows from the row node $N_{R(2)}$ to the ground terminal through the resistor rb1(2), the comparison node $N_{b(2)}$ and the resistor rb2(2) of the transition circuit TC(2). Since the switches sw(2,2), sw(3,2) and sw(4,2) are turned off, the voltage level of the row signal line R(2) is not affected by the un-scan voltage $V_{un-scan}$ of the column signal lines C(2)~C(4).

In the scan cycle scan(1), the current flows from the high-level column signal line C(1) to a row node $N_{R(4)}$ through the switch sw(1,4) and the resistor r(1,4) of the key unit KU(1,4), and then the current flows along four branches. One of the four branches of the current flows from the row node $N_{R(4)}$ to the ground terminal through the transition circuit TC(4). The other three branches of the current flow to the column signal lines C(2)~C(4) through the key units KU(2,4)~KU(4,4).

Since the voltages applied to the column signal lines C(1)~C(4) are different in different scan cycles, the influences of the depressed key units KU(1,4)~KU(4,4) on the voltage of the row signal line R(4) are different. In the scan cycle scan(1), the scan voltage $V_{scan}$ is transmitted to the row signal line R(4) through the switch sw(1,4) because the key unit KU(1,4) is depressed. Consequently, the voltage of the row signal line R(4) is increased. In the scan cycle scan(1), the key units KU(2,4)~KU(4,4) are also depressed. However, since the un-scan voltage $V_{un-scan}$ is transmitted from the column signal lines C(2)~C(4) to the row signal line R(4) through the switches sw(2,4), sw(3,4) and sw(4,4). Consequently, the voltage of the row signal line R(4) is decreased.

Figure 8A:
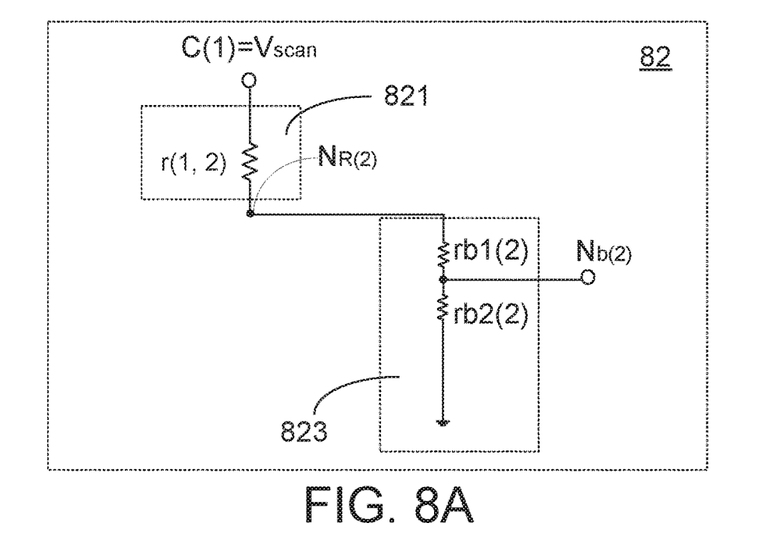
FIG. 8A is a schematic circuit diagram illustrating an equivalent circuit of the key units (1,2)~KU(4,2) and the transition circuit TC(2) in the scan cycle scan(1)

FIG. 8A is a schematic circuit diagram illustrating an equivalent circuit of the key unit (1,2) and the transition circuit TC(2) in the scan cycle scan(1). The equivalent circuit 82 of FIG. 8A includes a first part 821 and a second part 823. The row node $N_{R(2)}$ is connected between the first part 821 and the second part 823. The first part 821 includes the resistor r(1,2). The second part 823 includes the resistors rb1(2) and rb2(2). According to voltage division, the voltage of the row node $N_{R(2)}$ is given by equation (1):

$$V_{NR(2)} = \frac{rb1(2) + rb2(2)}{r(1,2) + rb1(2) + rb2(2)} \times V_{scan} \qquad \text{equation (1)}$$

Moreover, according to voltage division, the voltage of the comparison node $N_{b(2)}$ is given by equation (2):

$$V_{Nb(2)} = V_{NR(2)} \times \frac{rb2(2)}{rb1(2) + rb2(2)} \qquad \text{equation (2)}$$
$$= \frac{rb2(2)}{r(1,2) + rb1(2) + rb2(2)} \times V_{scan}$$

Figure 8B:
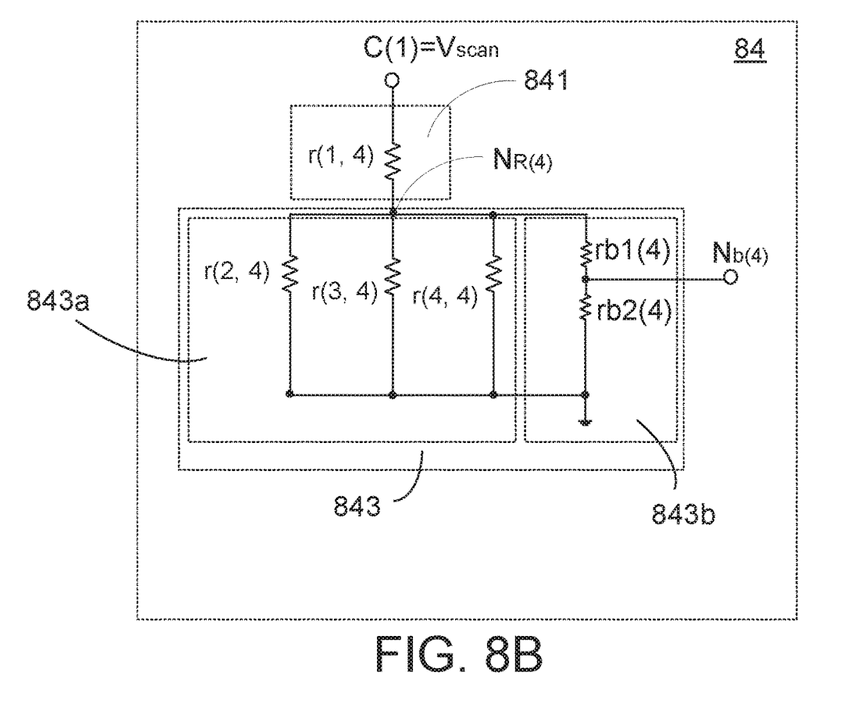
FIG. 8B is a schematic circuit diagram illustrating an equivalent circuit of the key units (1,4)~KU(4,4) and the transition circuit TC(4) in the scan cycle scan(1)

FIG. 8B is a schematic circuit diagram illustrating an equivalent circuit of the key unit (1,4) and the transition circuit TC(4) in the scan cycle scan(1). The equivalent circuit 84 of FIG. 8B includes a first part 841 and a second part 843. The row node $N_{R(4)}$ is connected between the first part 841 and the second part 843. The first part 841 includes the resistor r(1,4). The second part 843 includes the resistors r(2,4), r(3,4), r(4,4), rb1(4) and rb2(4). The second part 843 is divided into two sub-parts 843a and 843b. The sub-part

843a includes the resistors r(2,4), r(3,4) and r(4,4), which are included in the keyboard matrix. The sub-part 843b includes the resistors rb1(4) and rb2(4), which are included in the transition circuit TC(4).

The equivalent resistance rb4 of the serially-connected resistors rb1(4) and rb2(4) is expressed as: rb(4)=rb1(4)+rb2(4). The equivalent resistance $r_{//}$ of the resistors r(2,4), r(3,4), r(4,4) and rb4 in parallel is given by equation (3):

$$r_{//} = r(2,4) // r(3,4) // r(4,4) // rb(4) = \frac{1}{\frac{1}{r(2,4)} + \frac{1}{r(3,4)} + \frac{1}{r(4,4)} + \frac{1}{rb(4)}}$$ equation (3)

According to voltage division, the voltage of the row node $N_{R(4)}$ is obtained according to the relationship between the resistor r(1,4) and the equivalent resistance $r_{//}$. The voltage of the row node $N_{R(4)}$ is given by equation (4):

$$V_{NR(4)} = \frac{r_{//}}{r(1,4) + r_{//}} \times V_{scan}$$ equation (4)

Similarly, according to voltage division, the voltage of the comparison node $N_{b(4)}$ is given by equation (5):

$$V_{Nb(4)} = V_{NR(4)} = \frac{rb2(4)}{rb1(4) + rb2(4)}$$ equation (5)

Please refer to FIGS. 8A and 8B. Generally, rb1(2)=rb1(4), and rb2(2)=rb2(4). The control module 111 determines whether the key unit KU(1,4) is depressed according to the voltage of the comparison node $N_{b(4)}$. When the key unit KU(1,4) is depressed, regardless of whether one, two or three of the key units KU(2,4), KU(3, 4) and KU(4,4) are depressed, the voltage of the row node NR(4) has to be high enough. For example, the voltage of the row node NR(4) is higher than the threshold voltage (for example, 0.7V) of the transistor BJT (4). Consequently, the transition circuit TC(4) can make the accurate determination.

From equation (1) and equation (4), the coefficients to be multiplied by the scan voltage $V_{scan}$ influence the voltages of the row nodes $N_{R(2)}$ and $N_{R(4)}$. Since the equivalent resistance $r_{//}$ is the resistance of plural resistors, the equivalent resistance $r_{//}$ is certainly lower than the equivalent resistance rb(2) of the resistors rb1(2) and rb2(2), wherein rb(2)=rb1(2)+rb2(2). In other words, the voltage of the row node $N_{R(4)}$ in equation (4) is lower than the voltage of the row node $N_{R(2)}$ in equation (1), and the voltage of the comparison node $N_{b(4)}$ in equation (5) is lower than the voltage of the comparison node $N_{b(2)}$ in equation (2).

Please refer to FIGS. 8A and 8B again. When more key units in the same row are depressed, the number of the parallel-connected resistors is increased. Consequently, the voltage of the comparison node $N_{b(x)}$ is decreased. As mentioned above in FIG. 6, the voltages of the comparison nodes $N_{b(2)}$, $N_{b(3)}$ and $N_{b(4)}$ are somewhat different in the scan cycle. In the second row, only one key unit KU(1,2) is depressed. In the third row, two key units KU(1,3) and KU(2,3) are depressed. In the fourth row, four key units KU(1,4)~KU(4,4) are depressed. Consequently, the voltage V1on of the comparison node $N_{b(2)}$ is higher than the voltage V2on of the comparison node $N_{b(3)}$, and the voltage V2on of the comparison node $N_{b(3)}$ is higher than the voltage V4on of the comparison node $N_{b(4)}$.

When more key units in the same row are depressed simultaneously, the voltage of the comparison voltage may be too low. Under this circumstance, the transistor BJT is possibly turned off. If the transistor BJT is erroneously turned off, the voltage level of the row read node $N_{Rout(x)}$ is adversely affected. That is, the low level state $V_{RoutL}$ of the output voltage Rout(1)~Rout(N) is erroneously changed to the high level state $V_{RoutH}$.

For solving the above drawbacks, the voltages of the comparison nodes $N_{b(1)}$~$N_{b(N)}$ should be higher than the threshold voltage (for example, 0.7V) of the transistor BJT. Consequently, the transistor BJT is maintained in the on state when many key units in the same row are depressed. In practical application, it can be assumed a design scenario that all key units in a same row, for example, KU(1,x)~KU(M, x) which are electrically connected to the x-th column, are depressed simultaneously In the design scenario, the voltage of the comparison node $N_{b(x)}$ needs to be at least equivalent to t the threshold voltage Vth of the transistor BJT(x), and a threshold value of the scan voltage $V_{scan}$ ($V_{scan-th}$) can be obtained accordingly. Afterwards, the scan voltage $V_{scan}$ to be issued by the keyboard controller is required to be greater than or equivalent to the threshold value of the scan voltage ($V_{scan-th}$), that is, $V_{scan} \geq V_{scan-th}$. Therefore, it can be assured that voltage level of the base B(x) of the bipolar junction transistor BJT(x) is always at least 0.7V greater than voltage level the collector C(x) of the bipolar junction transistor BJT(x), regardless whether more than one key unit in the same row is depressed. Based on such design scenario, the BJT(x) will not be accidently turned off when plural key units in the same row are depressed simultaneously.

In case that the number of columns in the keyboard matrix is increased, the keyboard device of the present invention is additionally equipped with a boost circuit to provide a higher scan voltage $V_{scan}$ to the driving circuits. After a boost voltage Vup from the boost circuit is received by the driving circuit, the voltage level of the scan voltage $V_{scan}$ is increased. As the voltage level of the scan voltage $V_{scan}$ is increased, the voltage of the comparison node is increased. Consequently, the transistor BJT is maintained in the on state when many key units in the same row are depressed. For example, if the keyboard matrix has 8 columns of key units, the scan voltage $V_{scan}$ is increased to 15V by the boost circuit. Even if the number of the parallel-connected resistors is increased, the voltage level of the scan voltage $V_{scan}$ increased to by the boost circuit is sufficient to increase the voltages of the comparison nodes $N_{b(1)}$~$N_{b(N)}$. Consequently, the transistors BJT(1)~BJT(N) can be effectively turned on when the corresponding key units are depressed.

In case that the keyboard matrix has 144 key units, these key units are arranged in 8*18, 12*12 or 18*8 array. The magnitude of the boost voltage Vup from the boost circuit is determined according to the column number of the keyboard matrix. The increased column number indicates that more key units in the same row are possibly depressed simultaneously. Since the number of the parallel-connected resistors is increased, the equivalent resistance is reduced. That is, as the column number is increased, the magnitude of the boost voltage is correspondingly increased.

For example, in case that the keyboard matrix are arranged in 8*18 array, eight switches and eight resistors in each row are connected with each other in parallel. In this situation, the boost voltage Vup from the boost circuit is 15V. In case that the keyboard matrix are arranged in 18*8 array, eighteen switches and eighteen resistors in each row are connected with each other in parallel. In this situation, the boost voltage Vup from the boost circuit is 24V. That is, the magnitude of the boost voltage can be determined according to the practical requirements.

Figure 9:
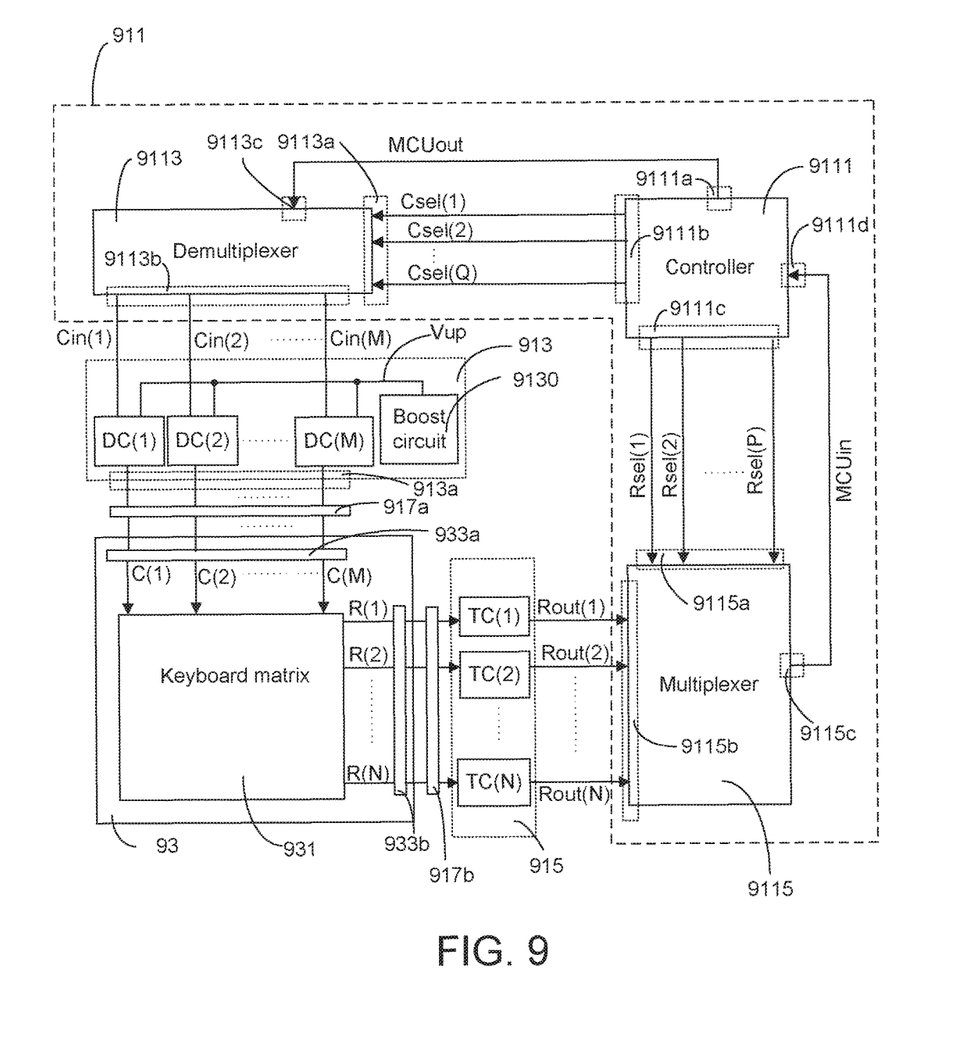
FIG. 9 is a schematic circuit diagram illustrating a keyboard device according to a second embodiment of the present invention.

FIG. 9 is a schematic circuit diagram illustrating a keyboard device according to a second embodiment of the present invention. The keyboard matrix 931, the reading module 915 and the driving circuits DC(1)~DC(M) are similar to those of FIG. 2, and are not redundantly described herein. The keyboard device of this embodiment further includes a boost circuit 9130. The boost circuit 9130 is included in the driving module 913. The boost circuit 9130 provides a boost voltage Vup with a higher voltage level to the driving circuits DC(1)~DC(M). Moreover, the control module 911 includes a multiplexer 9115 and/or a demultiplexer 9113.

In case that the control module 911 includes the demultiplexer 9113, a controller 9111 of the control module 911 includes a controller output port 9111a and Q column select ports 9111b, wherein Q is a positive integer smaller than M. The controller 9111 provides a scan voltage $V_{scan}$ through the controller output port 9111a. In case that the control module 911 includes the multiplexer 9115, the controller 9111 includes a controller input port 9111d and P select ports 9111c. The controller 9111 receives the output voltages Rout(1)~Rout(N) through the controller input port 9111d, wherein P is a positive integer smaller than N.

The demultiplexer 9113 includes a demultiplexer input port 9113c, Q column set ports 9113a and M driving output ports 9113b. The demultiplexer input port 9113c is connected with the controller output port 9111a through a controller output line MCUout. The Q column set ports 9113a are electrically coupled to the Q column select ports 9111b through controller column select lines Csel(1)~Csel(Q), respectively. The M driving output ports 9113b are electrically coupled to the M driving circuits DC(1)~DC(M), respectively. The use of the demultiplexer 9113 can reduce the pin number of the controller 9111. In practice, the number of the output pins of the demultiplexer 9113 is larger than or equal to the number of the driving circuits DC(1)~DC(M). Moreover, the type of the demultiplexer 9113 is determined according to the column number of the keyboard matrix.

The multiplexer 9115 includes a multiplexer output port 9115c, P row set ports 9115a, and N transition input ports 9115b. The multiplexer output port 9115c is electrically coupled to the controller input port 9111d through a controller input line MCUin. The P row set ports 9115a are electrically coupled to the P select ports 9111c through controller row select lines Rsel(1)~Rsel(P), respectively. The N transition input ports 9115b are electrically coupled to the N transition circuits TC(1)~TC(N), respectively. The use of the multiplexer 9115 can reduce the pin number of the controller 9111. In practice, the number of the input pins of the multiplexer 9115 is larger than or equal to the number of the transition circuits TC(1)~TC(N). Moreover, the type of the multiplexer 9115 is determined according to the row number of the keyboard matrix.

From the above descriptions, the present invention provides a keyboard device. In each scan cycle, the keyboard device can accurately determine whether the key units in the same column are depressed or undepressed. Consequently, the anti-ghosting purpose is achieved. Since the accuracy of determining the depressed states of the key units is enhanced, the keyboard device of the present invention is more competitive. Moreover, since the transition circuit uses the BJT transistor, the fabricating cost is largely reduced when compared with the prior art technology.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A keyboard device, comprising:
M driving circuits DC(1)~DC(M), wherein M is a positive integer;
N transition circuits TC(1)~TC(N), wherein N is a positive integer;
a control module comprising N input ports and M output ports, wherein the N input ports are electrically coupled to the N transition circuits TC(1)~TC(N) respectively, and the M output ports are electrically coupled to the M driving circuits DC(1)~DC(M) respectively;
M column signal lines C(1)~C(M) electrically coupled to the M driving circuits DC(1)~DC(M), respectively;
N row signal lines R(1)~R(N) electrically coupled to the N transition circuits TC(1)~TC(N), respectively, wherein M*N intersections are formed by the N row signal lines R(1)~R(N) extending across the M column signal lines C(1)~C(M); and
M*N key units KU(1,1)~KU(M,N) disposed neighboring to the M*N intersections, respectively, wherein a key unit KU(i,j) of the M*N key units KU(1,1)~KU(M,N) comprises a switch sw(i,j), wherein a first end of the switch sw(i,j) is connected with a column signal line C(i), a second end of the switch sw(i,j) is connected with a row signal line R(j), i is a positive integer smaller than or equal to M and represents which column signal line the switch sw(i,j) is connected, and j is a positive integer smaller than or equal to N and represents which row signal line the switch sw(i,j) is connected, wherein when the key unit KU(i,j) is depressed, the column signal line C(i) and the row signal line R(j) are electrically coupled to each other through the switch sw(i,j);
wherein the control module performs a scanning process to sequentially scan the M column signal lines C(1)~C(M) in M scan cycles scan(1)~scan(M), and the scanning process comprises steps of:
(a) setting an initial value of k, wherein the initial value of k is a positive integer smaller than or equal to M;
(b) entering a scan cycle scan(k);
(b1) providing a scan voltage to the k-th column signal line C(k) and providing an un-scan voltage to the column signal lines C(1)~C(k−1) and C(k+1)~C(M) through the M output ports, wherein a voltage level of the un-scan voltage is lower than a voltage level of the scan voltage;
(b2) determining whether N key units KU(k,1)~KU(k,N) connected with the k-th column signal line C(k) are conducted through the N transition circuits TC(1)~TC(N),
wherein when a key unit KU(k,x) connected with the k-th column signal line C(k) and the x-th row signal line R(x) is depressed, the scan voltage is transmitted from the k-th column signal line C(k) to the x-th row signal line R(x) through a switch sw(k,x) of the key unit KU(k,x), and the transition circuit TC(x) is turned on by the scan voltage, so that an output voltage Rout(x) from the transition circuit TC(x) has a first voltage level, wherein x is a positive integer smaller than or equal to N, wherein when a key unit KU(m, x) connected with the m-th column signal line C(m) and the x-th row signal line R(x) is depressed, the un-scan voltage is transmitted from the m-th column signal line C(m) to the x-th row signal line R(x) through a switch sw(m, x) of the key unit KU(m, x), wherein m is a positive integer smaller than or equal to M, and m is not equal to k;

wherein if the transition circuit TC(x) is turned on, the control module determines that the key unit KU(k,x) is depressed, wherein if the transition circuit TC(x) is turned off, the control module determines that the key unit KU(k,x) is not depressed; and (c) repeatedly performing the step (b1) and the step (b2) according to an updated k corresponding to the un-scanned column signal lines until all of the column signal lines C(1)~C(M) have been scanned once.

2. The keyboard device as claimed in claim 1, wherein if k is smaller than M in the step (c), k+1 is set as the updated k.

3. The keyboard device as claimed in claim 1, wherein the transistor circuit TC(x) comprises an NPN-type bipolar junction transistor BJT(x), wherein a base B(x) of the bipolar junction transistor BJT(x) is connected with the row signal line R(x), an emitter E(x) of the bipolar junction transistor BJT(x) is connected with a ground terminal, and a collector C(x) of the bipolar junction transistor BJT(x) is connected with a high supply voltage source and a k-th input port, wherein when the bipolar junction transistor BJT(x) is turned on in the scan cycle scan(k), the output voltage Rout(x) has the first voltage level, wherein when the bipolar junction transistor BJT(x) is turned off in the scan cycle scan(k), the output voltage Rout(x) has a second voltage level.

4. The keyboard device as claimed in claim 1, wherein the keyboard device further comprises a first connector and a second connector, wherein the first connector, the M driving circuits DC(1)~DC(M), the N transition circuits TC(1)~TC(N) and the control module are installed on a motherboard, wherein the second connector, the M column signal lines C(1)~C(M), the N row signal lines R(1)~R(N) and the M*N key units KU(1,1)~KU(M,N) are installed on a keyboard module, wherein when the keyboard module is assembled with the motherboard, the first connector and the second connector are connected with each other, the M driving circuits DC(1)~DC(M) are electrically coupled to the M column signal lines C(1)~C(M), and the N transition circuits TC(1)~TC(N) are electrically coupled to the N row signal lines R(1)~R(N).

5. The keyboard device as claimed in claim 1, wherein the control module comprises:

a controller comprising a controller output port and Q column select ports, wherein Q is a positive integer smaller than M; and a demultiplexer comprising a demultiplexer input port, Q column set ports and M driving output ports, wherein the demultiplexer input port is connected with the controller output port, the Q column set ports are electrically coupled to the Q column select ports, and the M driving output ports are electrically coupled to the M driving circuits.

6. The keyboard device as claimed in claim 1, wherein the control module comprises:

a controller comprising a controller input port and P select ports, wherein P is a positive integer smaller than N; and a multiplexer comprising a multiplexer output port, P row set ports and N transition input ports, wherein the multiplexer output port is electrically coupled to the controller input port, the P row set ports are electrically coupled to the P select ports, and the N transition input ports are electrically coupled to the N transition circuits.

7. The keyboard device as claimed in claim 1, wherein the keyboard device further comprises a boost circuit, and the boost circuit is electrically coupled to the M driving circuits DC(1)~DC(M) for increasing a voltage level of the scan voltage.

8. The keyboard device as claimed in claim 1, wherein if M key units KU(1,x)~KU(M,x) in the x-th row are depressed in the scan cycle scan(k), the scan voltage is transmitted from the column signal line C(k) to the x-th row signal line R(x) through the key unit KU(k, x), and the un-scan voltage is transmitted from the column signal lines C(1)~C(k−1) and C(k+1)~C(M) to the x-th row signal line R(x) through the other key units in the x-th row, wherein the output voltage Rout(x) generated from the transition circuit TC(x) has the first voltage level.

* * * * *